(12) United States Patent
Kwon et al.

(10) Patent No.: US 10,929,635 B2
(45) Date of Patent: Feb. 23, 2021

(54) DISPLAY DEVICE INCLUDING A FINGERPRINT SCANNER

(71) Applicant: LG Display Co., Ltd., Seoul (KR)

(72) Inventors: Suchan Kwon, Seoul (KR); ChiKyung Sung, Seoul (KR); Yonghee Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 254 days.

(21) Appl. No.: 15/981,521

(22) Filed: May 16, 2018

(65) Prior Publication Data

US 2019/0073505 A1 Mar. 7, 2019

(30) Foreign Application Priority Data

Sep. 5, 2017 (KR) .......................... 10-2017-0113451
Nov. 10, 2017 (KR) .......................... 10-2017-0149150

(51) Int. Cl.

| G06K 9/00 | (2006.01) |
|---|---|
| H01L 27/32 | (2006.01) |
| G01B 11/24 | (2006.01) |
| G01B 17/06 | (2006.01) |
| H01L 51/52 | (2006.01) |

(Continued)

(52) U.S. Cl.
CPC ............ *G06K 9/0002* (2013.01); *G01B 11/24* (2013.01); *G01B 17/06* (2013.01); *G06K 9/0004* (2013.01); *H01L 27/323* (2013.01); *H01L 51/529* (2013.01); *H05K 1/0203* (2013.01); *H05K 1/028* (2013.01); *H05K 1/0254* (2013.01); *H05K 1/189* (2013.01); *H05K 5/0017* (2013.01); *H05K 7/20963* (2013.01); *H01L 27/3225* (2013.01); *H01L 27/3227* (2013.01); *H01L 2251/5338* (2013.01); *H05K 2201/066* (2013.01);

(Continued)

(58) Field of Classification Search
CPC ......... G06F 3/041; G06F 3/00; H01L 27/323; H01L 27/3234; H01L 51/59; H01L 27/3225; H01L 27/3227; H01L 2251/5338; G06K 9/0002; G06K 9/0004; G06K 19/07707; G06K 2209/03; G01B 11/24; H05K 1/0203; H05K 1/0254; H05K 1/028; H05K 1/189; H05K 5/0017; H05K 7/20963; H05K 2201/66; H05K 2201/10121; H05K 2201/10128; H05K 2201/10151
See application file for complete search history.

(56) References Cited

U.S. PATENT DOCUMENTS

2018/0284512 A1* 10/2018 Lee .................. G06F 1/1684
2018/0373913 A1* 12/2018 Panchawagh ....... G01S 15/8925

FOREIGN PATENT DOCUMENTS

KR 10-1719975 B1 3/2017

* cited by examiner

*Primary Examiner* — Suman K Nath
(74) *Attorney, Agent, or Firm* — Birch, Stewart, Kolasch & Birch, LLP

(57) ABSTRACT

A display device can include a cover substrate; a display module disposed on a rear surface of the cover substrate and configured to display an image; a heat dissipation film disposed on a rear surface of the display module; a hole disposed in the heat dissipation film; a flexible circuit board covering the hole in the heat dissipation film and configured to block light; and a fingerprint scanner mounted on the flexible circuit board, disposed in the hole of the heat dissipation film, and separated from the heat dissipation film by a space, in which the flexible circuit board covers the space between the heat dissipation film and the fingerprint scanner.

13 Claims, 8 Drawing Sheets

(51) Int. Cl.
  *H05K 1/02* (2006.01)
  *H05K 1/18* (2006.01)
  *H05K 5/00* (2006.01)
  *H05K 7/20* (2006.01)
(52) U.S. Cl.
  CPC .............. *H05K 2201/10121* (2013.01); *H05K 2201/10128* (2013.01); *H05K 2201/10151* (2013.01)

DISPLAY DEVICE INCLUDING A FINGERPRINT SCANNER

CROSS-REFERENCE TO RELATED APPLICATIONS

This application claims the benefit of Korean Patent Application No. 10-2017-0113451 filed in the Republic of Korea on Sep. 5, 2017, and Korean Patent Application No. 10-2017-0149150 filed in the Republic of Korea on Nov. 10, 2017, all of which are hereby incorporated by reference as if fully set forth herein.

BACKGROUND OF THE INVENTION

Field of the Invention

The present disclosure relates to a display device including a fingerprint scanner.

Description of the Related Art

With the advancement of an information-oriented society, various requirements for display devices for displaying an image are increasing. Various display devices such as liquid crystal display (LCD) devices, organic light emitting display devices, and quantum dot light emitting display devices are being practically used.

Display devices are being applied to various electronic devices such as smartphones, tablet personal computers (PCs), notebook computers, monitors, televisions (TVs), etc. Recently, the use of portable electronic devices such as smartphones, tablet PCs, and notebook computers has greatly increased due to the advancement of mobile communication technology. Portable electronic devices store privacy information such as contact numbers, call history, messages, photographs, memos, Web surfing information about a user, position information, and financial information, in addition to a communication function. Therefore, in order to prevent privacy information from being leaked from portable electronic devices, various security methods for protecting privacy information are being applied to portable electronic devices. As an example of the various security methods, a fingerprint authentication method allows the use of an electronic device based on a fingerprint included in biometric information about a user, and thus, has the stability of security which is better than the other security methods (for example, a secret number authentication method, a pattern authentication method, etc.).

In portable electronic devices such as smartphones and tablet PCs, a bezel is minimized for providing a wider screen, and a size of a display device is enlarged. However, a display device, an image sensor for implementing a camera, an illumination sensor for sensing illumination, a finger identification sensor for fingerprint authentication, and/or the like are disposed on a front surface of each of portable electronic devices such as smartphones and tablet PCs, and thus, there is a limitation in enlarging a size of the display device.

In order to enlarge a size of the display device, the fingerprint scanner may be attached on a rear surface of the display device. In this instance, a portion of a rear tape attached on the rear surface of the display device is removed, and then, the fingerprint scanner is attached on the rear surface. In this instance, a space may be provided between the rear tape and the fingerprint scanner. When the display device is implemented as an organic light emitting display device including a plastic film, light can pass through the space between the rear tape and the fingerprint scanner in a manufacturing process, and due to this, an organic light emitting device provided in an area including the space can be deteriorated. For this reason, the organic light emitting device provided in the area including the space between the rear tape and the fingerprint scanner and an organic light emitting device provided in the other area (for example, an area from which the rear tape is not removed) can have a difference in deterioration speed. Therefore, even in a situation of displaying an image having the same brightness, there can be a difference between a luminance of an image, displayed by the organic light emitting device provided in the area including the space between the rear tape and the fingerprint scanner, and a luminance of an image displayed by the organic light emitting device provided in the area from which the rear tape is not removed. As a result, smears such as shadow mura where a luminance difference occurs between the area including the space between the rear tape and the fingerprint scanner and the area from which the rear tape is not removed can be perceived by a user.

SUMMARY OF THE INVENTION

Accordingly, the present disclosure is directed to provide a display device including a fingerprint scanner that substantially obviates one or more problems due to limitations and disadvantages of the related art.

An aspect of the present disclosure is directed to provide a display device which prevents smears such as shadow mura from being perceived by a user when a fingerprint scanner is attached on a rear surface of the display device.

In addition to the aforesaid objects of the present disclosure, other features and advantages of the present disclosure will be described below, but will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device including a cover substrate, a display module disposed on a rear surface of the cover substrate and configured to display an image, a heat dissipation film disposed on a rear surface of the display module, a hole disposed in the heat dissipation film, a flexible circuit board covering the hole in the heat dissipation film and configured to block light, and a fingerprint scanner mounted on the flexible circuit board, disposed in the hole of the heat dissipation film, and separated from the heat dissipation film by a space, wherein the flexible circuit board covers the space between the heat dissipation film and the fingerprint scanner.

In another aspect of the present disclosure, there is provided a display device including a display module configured to display an image, a heat dissipation film disposed on a rear surface of the display module, a hole disposed in the heat dissipation film, a fingerprint scanner disposed on the rear surface of the display module inside the hole of the heat dissipation film, and a light blocking structure disposed in a space between the fingerprint scanner and the heat dissipation film, and configured to block light.

In another aspect of the present disclosure, there is provided a display device including a display module configured to display an image, a supplement layer disposed on a rear surface of the display module, a fingerprint scanner disposed on the rear surface of the display module, and an air gap between the supplement layer and the display module, and overlapping with the fingerprint scanner.

In another aspect of the present disclosure, there is provided a display device including a display module disposed on a cover substrate to display an image, a heat dissipation film disposed on a rear surface of the display module and including a hole, a fingerprint scanner attached on the rear surface of the display module in the hole of the heat dissipation film, and a resin filled into a space between the fingerprint scanner and the heat dissipation film.

Both the foregoing general description and the following detailed description of the present disclosure are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
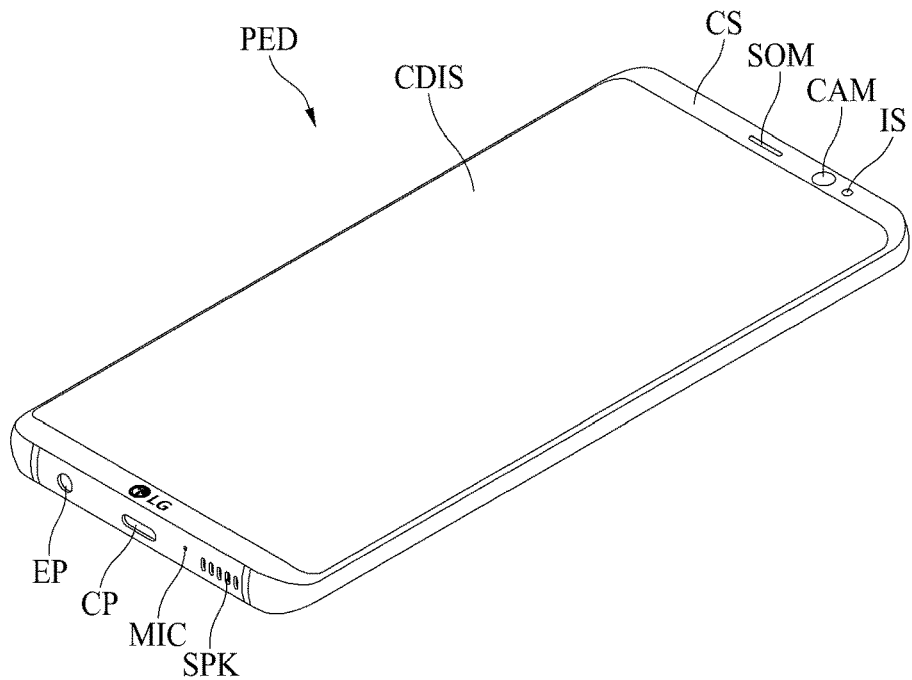
FIG. 1 is a perspective view illustrating a portable electronic device including a display device according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

In the specification, it should be noted that like reference numerals already used to denote like elements in other drawings are used for elements wherever possible. In the following description, when a function and a configuration known to those skilled in the art are irrelevant to the main configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings illustrating embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

When "comprise," "have" and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on," "over," "under" and "next," one or more other parts may be disposed between the two parts unless 'just' or 'direct' is used.

In describing a time relationship, for example, when the temporal order is described as "after," "subsequent," "next," and "before," a situation which is not continuous may be included unless "just" or "directly" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be performed independently from each other, or may be performed together in co-dependent relationship.

Hereinafter, example embodiments of the present disclosure will be described in detail with reference to the accompanying drawings.

FIG. 1 is a perspective view illustrating a portable electronic device PED including a display device according to an embodiment of the present disclosure.

Referring to FIG. 1, the portable electronic device PED according to an embodiment of the present disclosure is illustrated as a smartphone, but is not limited thereto. That is, the portable electronic device PED according to an embodiment of the present disclosure may be a tablet PC, a notebook computer, or the like.

The portable electronic device PED may include a case CS forming an external appearance, a display device CDIS, a sound output module SOM, an image sensor CAM, an illumination sensor IS, a speaker SPK, a microphone MIC, an earphone port EP, and a charging port CP.

The case CS may be provided to cover a front surface, a side surface, and a rear surface of the portable electronic device PED. The case CS may be formed of plastic. The display device CDIS, the sound output module SOM, and the image sensor (or a camera) CAM, and the illumination sensor IS may be disposed on the front surface of the case CS. The microphone MIC, the earphone port EP, and the charging port CP may be disposed on one side surface of the case CS.

The display device CDIS may occupy the most area of the front surface of the portable electronic device PED. The display device CDIS will be described in detail with reference to FIGS. 2 and 3.

The sound output module SOM may be a reception device that outputs a sound of the other party when talking over a telephone. The image sensor CAM may be a device for capturing an image seen in front of the portable electronic device, and another image sensor may be additionally disposed on the rear surface of the portable electronic device PED. The illumination sensor IS may be a device which senses the amount of incident light to control illuminance of the display device CDIS. The microphone MIC may be a transmission device which converts a sound wave of a voice of a user into an electrical signal when talking with the other party, and transmits the electrical signal. The speaker SPK may output a sound signal associated with an application or a function executed in the portable electronic device PED. The earphone port EP may be a port which, when an earphone is inserted into the port, outputs a sound signal to the earphone, instead of the speaker SPK. The charging port CP may be a port to which a charger for charging a battery of the portable electronic device PED is connected.

Figure 2:
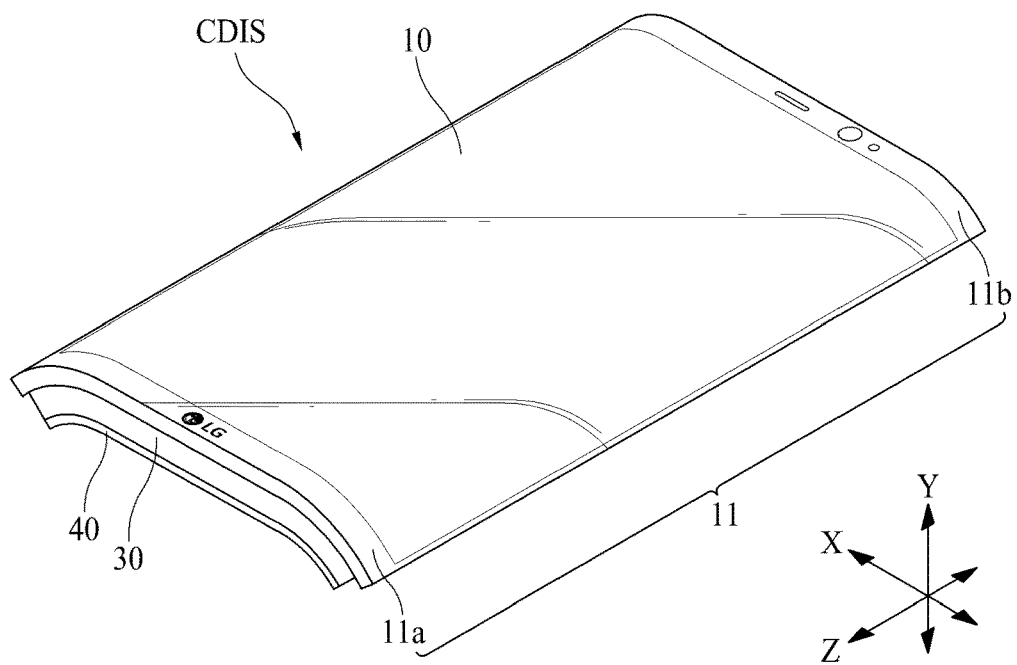
FIG. 2 is a perspective view illustrating a display device according to an embodiment of the present disclosure.
Figure 3:
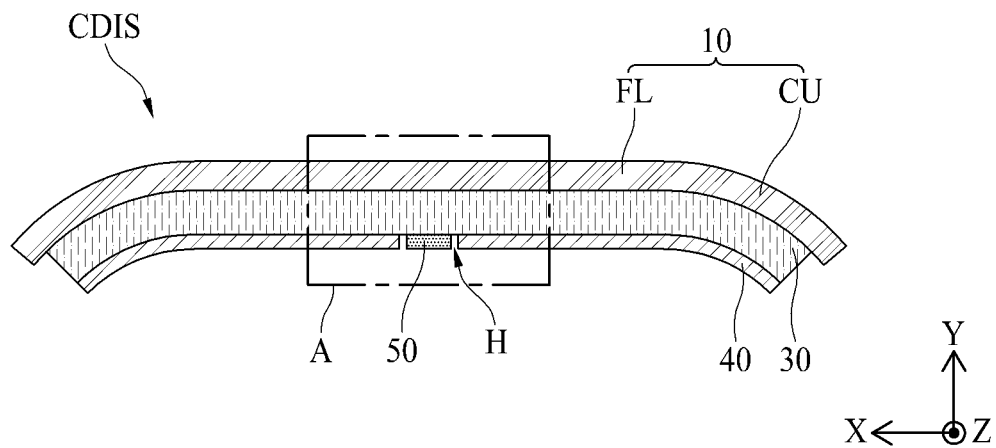
FIG. 3 is a cross-sectional view of one side of a display device according to an embodiment of the present disclosure.

FIG. 2 is a perspective view illustrating a display device according to an embodiment of the present disclosure. FIG. 3 is a cross-sectional view of one side of a display device according to an embodiment of the present disclosure.

Referring to FIGS. 2 and 3, the display device according to an embodiment of the present disclosure may include a cover substrate 10, a display module 30, a heat dissipation film 40, and a fingerprint scanner 50.

The cover substrate 10 may be formed of plastic, glass, and/or the like. The cover substrate 10 may include a flat part FL and a curvature part CU. The flat part FL may be flatly provided in a center area of the cover substrate 10. The curvature part CU may be provided in at least one edge of the cover substrate 10 to have a first curvature. In FIGS. 1 to 3, the curvature part CU is illustrated as being provided in each of both edges of the cover substrate 10, but is not limited thereto. For example, the curvature part CU may be provided in only one edge of the cover substrate 10, or may be provided in each of three edges or four edges.

A decoration layer 11 may be provided on a rear surface of the cover substrate 10 facing the display module 30. The decoration layer 11 may be a layer including a pattern which is seen by a user even when the display module 30 does not display an image. For example, as in FIG. 2, a logo 11a of a company such as "LG" may be provided on the decoration layer 11. Also, the decoration layer 11 may include a color layer 11b which is provided in an area corresponding to a bezel area of the display module 30. For example, the decoration layer 11 may include the color layer 11b having black which is provided in the area corresponding to the bezel area of the display module 30. In this instance, when the display module 30 does not display an image, the color layer 11b of the decoration layer 11 may be shown in the same color as that of a display area of the display module 30, and thus, a screen of the display module 30 is widely seen by a user.

The display module 30 may be disposed on a rear surface of the cover substrate 10. The display module 30 may be a display device for displaying an image. For example, as in FIGS. 5 and 6, the display module 30 may be an organic light emitting display device, but is not limited thereto. In other embodiments, the display module 30 may be an LCD device or a quantum dot light emitting display device.

The display module 30 may be disposed on the flat part FL and the curvature part CU of the cover substrate 10. Since the display module 30 is also disposed in the curvature part CU of the cover substrate 10, the user can even see an image through the curvature part CU of the cover substrate 10.

The heat dissipation film 40 may be disposed on a rear surface of the display module 30. The heat dissipation film 40 may include a material having high thermal conductivity to effectively dissipate heat occurring in the display module 30. Also, the heat dissipation film 40 may perform a buffering function for protecting the display module from an external impact.

A portion of the heat dissipation film 40 may be removed for attaching the fingerprint scanner 50 on the rear surface of the display module 30. Hereinafter, an area from which a portion of the heat dissipation film 40 is removed may be referred to as a hole H.

The fingerprint scanner 50 may be attached on the rear surface of the display module 30 in a hole H of the heat dissipation film 40. The fingerprint scanner 50 may identify a fingerprint of the user by using an optical type or an ultrasound type.

When the fingerprint scanner 50 is the optical type, the fingerprint scanner 50 may include a light source, which irradiates light onto a front surface on which the display module 30 is disposed, and an optical sensor which receives light reflected by a fingerprint of a finger and converts the received light into an electrical signal. The light source may be a laser or a light emitting diode (LED) and may be disposed in an edge of the display module 30. The optical sensor may be a complementary metal oxide semiconductor (CMOS) image sensor or a charge coupled device (CCD) image sensor. In this instance, the light emitted from the light source may be reflected and absorbed by a ridge and a valley of a fingerprint of a finger, and thus, fingerprint pattern information about the finger may be sensed by the optical sensor of the fingerprint scanner 50.

When the fingerprint scanner 50 is the ultrasound type, the fingerprint scanner 50 may irradiate an ultrasound wave onto the front surface on which the display module 30 is disposed, and may determine a pattern of a fingerprint of a finger, based on a level of the ultrasound wave reflected by the fingerprint of the finger. In more detail, a fingerprint of a user has a valley and a ridge because of having a crest, and a level of a reflected ultrasound wave may vary based on a portion from which an irradiated ultrasound wave is reflected, whereby the fingerprint scanner 50 may obtain a contour of the fingerprint, based on a pattern of the reflected ultrasound wave. When the fingerprint scanner 50 is the ultrasound type, the fingerprint scanner 50 may include a fingerprint input unit and a fingerprint processing unit. The fingerprint input unit may include an ultrasound transmitter, which generates an ultrasound wave, and an ultrasound receiver which receives an ultrasound wave. The fingerprint processing unit may include a controller which processes a value received from the ultrasound receiver to determine whether to authenticate a fingerprint.

Figure 4:
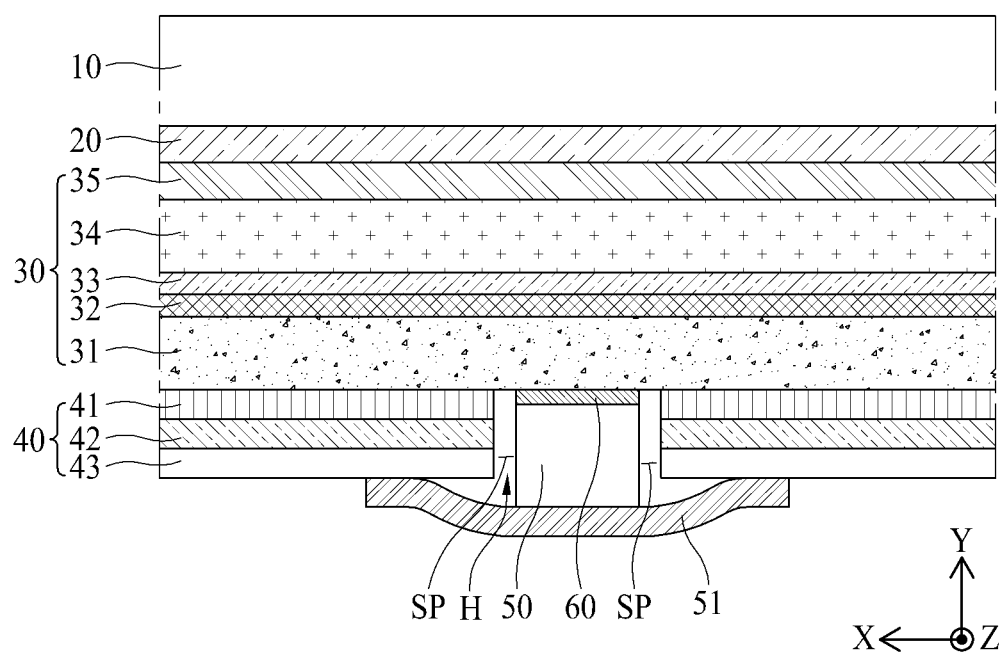
FIG. 4 is an enlarged cross-sectional view illustrating a first example of an area A of FIG. 3 according to an embodiment of the present disclosure.

FIG. 4 is an enlarged cross-sectional view illustrating a first example of an area A of FIG. 3.

Referring to FIG. 4, a display device according to a first embodiment of the present disclosure can include a cover substrate 10, a display module 30, a heat dissipation film 40, a fingerprint scanner 50, a first adhesive layer 20, a flexible circuit board 51, and a second adhesive layer 60. Also, the display module 30 can include a support substrate 31, a flexible substrate 32, a pixel array layer 33, a barrier film 34, and a polarization film 35. Also, the heat dissipation film 40 may include a cushion layer 41, a heat dissipation layer 42, and an anti-electrostatic layer 43.

The first adhesive layer 20 can be disposed between the cover substrate 10 and the display module 30 and may attach the cover substrate 10 on a polarizer of the display module 30. The first adhesive layer 20 may be an optically cleared resin (OCR) or an optically cleared adhesive (OCA) film.

The support substrate 31 may be a substrate for supporting the flexible substrate 32 and may be formed of plastic and/or the like. For example, the support substrate 31 may be formed of polyethylene terephthalate (PET) and/or the like, but is not limited thereto.

The flexible substrate 32 can be disposed on a front surface of the support substrate 31 and may be formed of a plastic film having flexibility. For example, the flexible substrate 32 may be formed of a polyimide film, but is not limited thereto.

The pixel array layer 33 can be provided on a front surface of the flexible substrate 32. The pixel array layer 33 may be a layer which displays an image by using a plurality of pixels. The pixel array layer 33 may include a thin film transistor (TFT) layer, a light emitting device layer, and an encapsulation layer.

The barrier film 34 can be disposed to cover the pixel array layer 33, for protecting the pixel array layer 33 from oxygen, water, and/or the like. For example, the barrier film 34 may be disposed on the pixel array layer 33. The barrier film 34 may further include a touch sensing layer for sensing a touch of a user.

The polarization film 35 can be attached on a front surface of the barrier film 34, for preventing visibility from being reduced due to reflection of external light. The polarization film 35 may be disposed to overlap the pixel array layer 33.

The display module 30 will be described below with reference to FIGS. 5 and 6.

The cushion layer 41 can be disposed on a rear surface of the support substrate 31. When an external impact is applied to the display module 30, the cushion layer 41 may reduce the impact. An adhesive material may be coated on a front surface of the cushion layer 41, and thus, the heat dissipation film 40 may be attached on the rear surface of the support substrate 31 without a separate adhesive layer.

The heat dissipation layer 42 can be disposed on a rear surface of the cushion layer 41. The heat dissipation layer 42 may be formed of a metal layer (for example, graphite) having high thermal conductivity to effectively dissipate heat occurring in the display module 30, but is not limited thereto.

The anti-electrostatic layer 43 can be disposed on a rear surface of the heat dissipation layer 42. The anti-electrostatic layer 43 may protect the display module 30 from static electricity applied from the outside, and like the heat dissipation layer 42, the anti-electrostatic layer 43 may dissipate the heat occurring in the display module 30. The anti-electrostatic layer 43 may be formed of a metal such as copper (Cu), but is not limited thereto.

The fingerprint scanner 50 may be mounted on the flexible circuit board 51. The flexible circuit board 51 may be a flexible printed circuit board (FPCB). The flexible circuit board 51 may include a connector connected to a cable connected to an application board of a portable electronic device. An application chip may be mounted on the application board. Therefore, information about fingerprint authentication by the fingerprint scanner 50 may be transmitted to the application board of the portable electronic device through the flexible circuit board 51.

The fingerprint scanner 50 may be disposed in the hole H of the heat dissipation film 40. The hole H of the heat dissipation film 40 may be an area from which a portion of the heat dissipation film 40 is removed, for attaching the fingerprint scanner 50 on the rear surface of the display module 30. Since the fingerprint scanner 50 is disposed in the hole H of the heat dissipation film 40, a space SP may be provided between the fingerprint scanner 50 and the heat dissipation film 40. When light passes through the space SP between the fingerprint scanner 50 and the heat dissipation film 40, an organic light emitting device provided in an area corresponding to the space SP between the fingerprint scanner 50 and the heat dissipation film 40 can be deteriorated.

The flexible circuit board 51 may be disposed to cover the hole H of the heat dissipation film 40. For example, a width of the flexible circuit board 51 in a first direction (an X-axis direction) and a width of the flexible circuit board 51 in a second direction (a Z-axis direction) intersecting the first direction may be set wider than a width of the hole H of the heat dissipation film 40 in the first direction (the X-axis direction) and a width of the hole H in the second direction (the Z-axis direction). Therefore, light is prevented from passing through the space SP between the fingerprint scanner 50 and the heat dissipation film 40.

Moreover, the flexible circuit board 51 may contact the rear surface of the heat dissipation film 40 (for example, a rear surface of the anti-electrostatic layer 43). The flexible circuit board 51 may have flexibility, and thus, as in FIG. 4, an end of the flexible circuit board 51 may be bent and may thereby contact the rear surface of the heat dissipation film 40. The flexible circuit board 51 may be attached on the rear surface of the heat dissipation film 40 by using a double-sided adhesive film. In this instance, the flexible circuit board 51 may more effectively prevent light from passing through the space SP between the fingerprint scanner 50 and the heat dissipation film 40 (e.g., the FPCB can form a seal around the outer edges of the hole).

The second adhesive layer 60 may attach the support substrate 31 on the fingerprint scanner 50. The second adhesive layer 60 may be an OCA film.

As described above, in the first embodiment of the present disclosure, the flexible circuit board 51 may be disposed to cover the hole H of the heat dissipation film 40. As a result, in the first embodiment of the present disclosure, light is prevented from passing through the space SP between the fingerprint scanner 50 and the heat dissipation film 40, and thus, a luminance difference caused by the deterioration of an organic light emitting device does not occur between an area including the space SP between the heat dissipation film 40 and the fingerprint scanner 50 and another area from which the heat dissipation film 40 is not removed. Accordingly, according to the first embodiment of the present disclosure, smears such as shadow mura are not perceived by a user.

Figure 5:
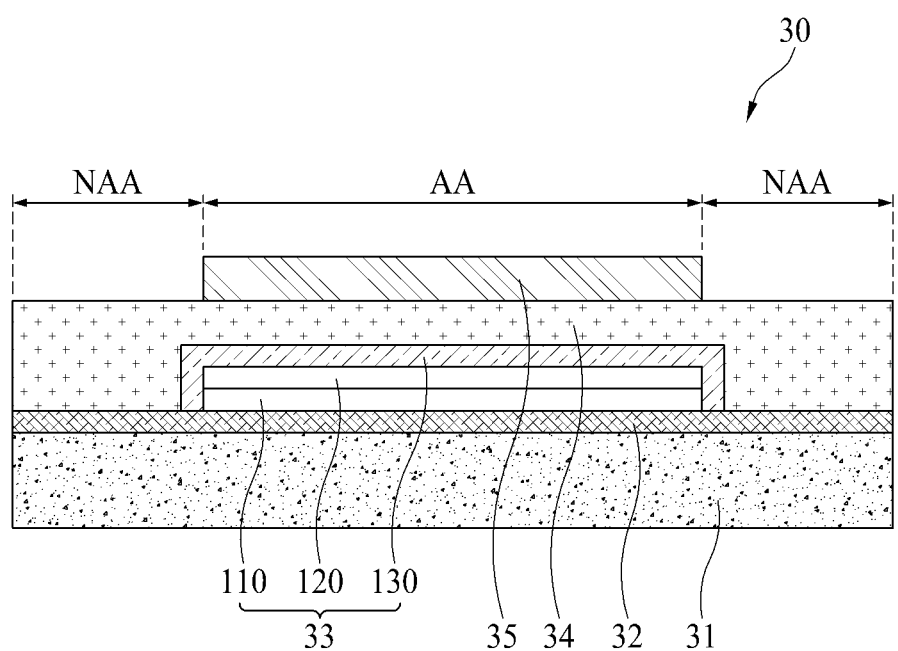
FIG. 5 is a cross-sectional view illustrating an example of a display module of FIG. 4 according to an embodiment of the present disclosure.

FIG. 5 is a cross-sectional view illustrating an example of the display module of FIG. 4. FIG. 6 is a cross-sectional view illustrating in detail a display area of a display module of FIG. 5.

Figure 6:
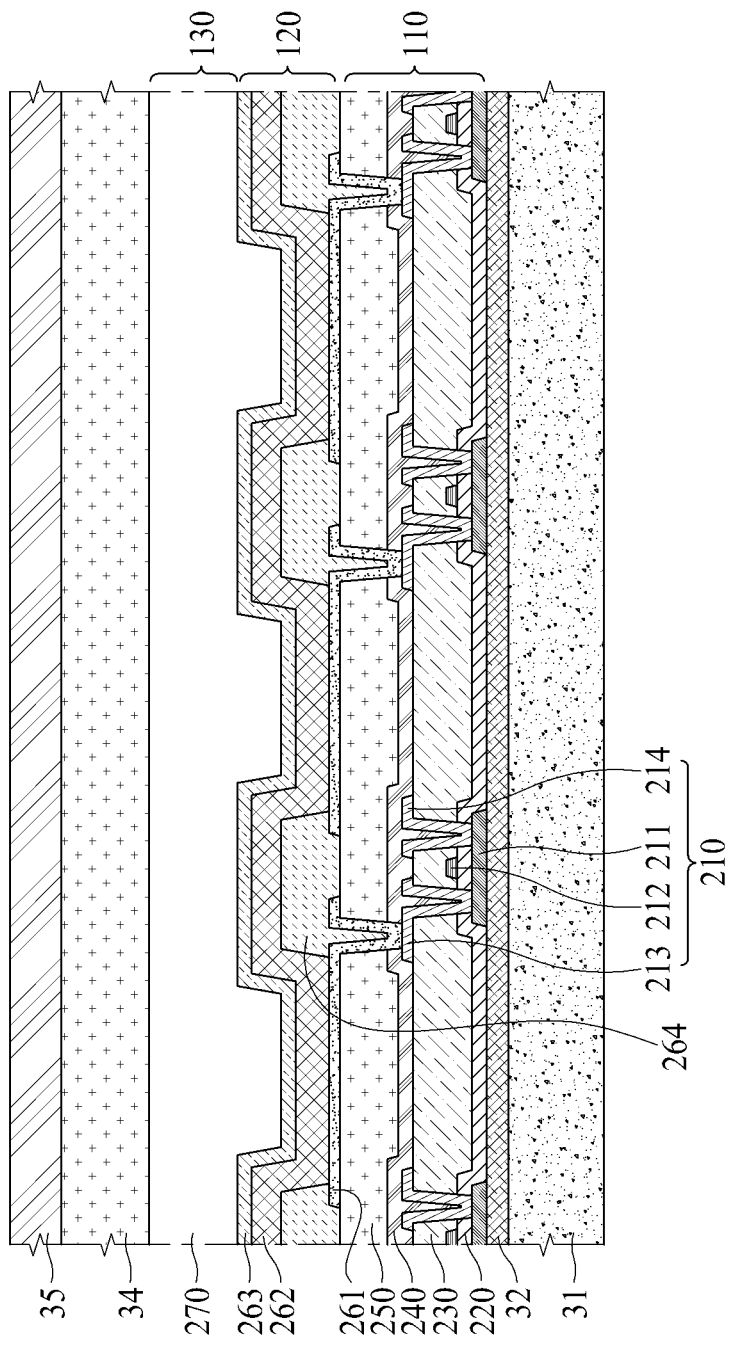
FIG. 6 is a cross-sectional view illustrating in detail a display area of a display module of FIG. 5 according to an embodiment of the present disclosure.

In FIGS. 5 and 6, an example where a display module 30 is implemented as an organic light emitting display device will be described. Also, in FIGS. 5 and 6, an example where the display module 30 is provided as a top emission type where a light emitting device layer 120 emits light in a direction (for example, an up direction) in which a barrier film 34 is disposed will be described.

Referring to FIGS. 5 and 6, the display module 30 can include a support substrate 31, a flexible substrate 32, a pixel array layer 33, a barrier film 34, and a polarization film 35. Also, the pixel array layer 33 can include a TFT layer 110, a light emitting device layer 120, and an encapsulation layer 130. A display area AA may denote an area where the light emitting device layer 120 is provided to display an image, and a non-display area NAA may denote a peripheral area near the display area AA.

The support substrate 31, the flexible substrate 32, the barrier film 34, and the polarization film 35 have been described above in detail with reference to FIGS. 4 and 5, and thus, their detailed descriptions are not repeated.

The TFT layer 110 may be provided on the flexible substrate 32. The TFT layer 110 may include a plurality of TFTs 210, a gate insulation layer 220, an interlayer dielectric 230, a passivation layer 240, and a planarization layer 250.

A buffer layer may be provided on the flexible substrate 32. The buffer layer may be provided on the flexible substrate 32, for protecting the plurality of TFTs 210 and a plurality of light emitting devices from water which penetrates through the support substrate 31 and the flexible substrate 32 vulnerable to penetration of water. The buffer layer may include a plurality of inorganic layers which are alternately stacked. For example, the buffer layer may be formed of a multilayer where one or more inorganic layers of silicon oxide (SiOx), silicon nitride (SiNx), and SiON are alternately stacked. The buffer layer may be omitted.

The TFTs 210 may be provided on the buffer layer. Each of the TFTs 210 may include an active layer 211, a gate electrode 212, a source electrode 213, and a drain electrode 214. In FIG. 6, the TFTs 210 are illustrated as being provided as a top gate type where the gate electrode 212 is disposed on the active layer 211 as an example, but is not limited thereto. In other embodiments, the TFTs 210 may be provided as a bottom gate type where the gate electrode 212 is disposed under the active layer 211 or a double gate type where the gate electrode 212 is disposed both on and under the active layer 211.

The active layer 211 may be provided on the buffer layer. The active layer 211 may be formed of a silicon-based semiconductor material, an oxide-based semiconductor material, and/or the like. A light blocking layer for blocking external light incident on the active layer 211 may be provided between the buffer layer and the active layer 211.

A gate insulation layer 220 may be provided on the active layer 211. The gate insulation layer 220 may be formed of an inorganic layer, and for example, may be formed of silicon oxide (SiOx), silicon nitride (SiNx), or a multilayer thereof.

The gate electrode 212 and a gate line may be provided on the gate insulation layer 220. The gate electrode 212 and the gate line may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

The interlayer dielectric 230 may be provided on the gate electrode 212 and the gate line. The interlayer dielectric 230 may be formed of an inorganic layer, and for example, may be formed of SiOx, SiNx, or a multilayer thereof.

The source electrode 213, the drain electrode 214, and a data line may be provided on the interlayer dielectric 230. Each of the source electrode 213 and the drain electrode 214 may contact the active layer 211 through a contact hole which passes through the gate insulation layer 220 and the interlayer dielectric 230. The source electrode 213, the drain electrode 214, and the data line may each be formed of a single layer or a multilayer which includes one of Mo, Al, Cr, Au, Ti, Ni, Nd, and Cu, or an alloy thereof.

The passivation layer 240 for insulating the TFTs 210 may be provided on the source electrode 213, the drain electrode 214, and the data line. The passivation layer 240 may be formed of an inorganic layer, and for example, may be formed of SiOx, SiNx, or a multilayer thereof.

The planarization layer 250 for planarizing a step height caused by the TFTs 210 may be provided on the passivation layer 240. The planarization layer 250 may be formed of an organic layer such as acryl resin, epoxy resin, phenolic resin, polyamide resin, polyimide resin, and/or the like.

The light emitting device layer 120 may be provided on the TFT layer 110. The light emitting device layer 120 may include a plurality of light emitting devices and a bank 264.

The plurality of light emitting devices and the bank 264 may be provided on the planarization layer 250. Each of the light emitting devices may be an organic light emitting device. Each of the light emitting devices may include a first electrode 261, a light emitting layer 262, and a second electrode 263. The first electrode 261 may be an anode electrode, and the second electrode 263 may be a cathode electrode.

The first electrode 261 may be provided on the planarization layer 250. The first electrode 261 may be connected to the source electrode 213 of a corresponding TFT 210 through a contact hole which passes through the passivation layer 240 and the planarization layer 250. The first electrode

261 may be formed of a metal material, having a high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, and/or the like. The APC alloy may be an alloy of silver (Ag), palladium (Pd), and Cu.

The bank 264 may be provided to cover an edge of the first electrode 261 on the planarization layer 250, for dividing a plurality of pixels. That is, the bank 264 may act as a pixel defining layer which defines the pixels.

Each of the pixels may denote an area where the first electrode 261 corresponding to the anode electrode, the light emitting layer 262, and the second electrode 263 corresponding to the cathode electrode are sequentially stacked, and a hole from the first electrode 261 and an electron from the second electrode 263 are combined in the light emitting layer 262 to emit light.

The light emitting layer 262 may be provided on the first electrode 261 and the bank 264. The light emitting layer 262 may be an organic light emitting layer. In this instance, the light emitting layer 262 may be a common layer which is provided in the pixels in common, and may be a white light emitting layer that emits white light. The light emitting layer 262 may be provided in a tandem structure of two or more stacks. Each of the stacks may include a hole transporting layer, at least one light emitting layer, and an electron transporting layer.

Moreover, when the light emitting layer 262 is provided in the tandem structure of two or more stacks, a charge generating layer may be provided between adjacent stacks. The charge generating layer may include an n-type charge generating layer, disposed adjacent to a lower stack, and a p-type charge generating layer which is provided on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer where an organic host material having an ability to transport electrons is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generating layer may be an organic layer where a dopant is doped on an organic host material having an ability to transport holes.

The second electrode 263 may be provided on the light emitting layer 262. The second electrode 263 may be provided to cover the light emitting layer 262. The second electrode 263 may be a common layer which is provided in the pixels in common.

The second electrode 263 may be formed of a transparent conductive material (TCO), such as indium tin oxide (ITO) or indium zinc oxide (IZO) capable of transmitting light, or a semi-transmissive conductive material such as Mg, Ag, or an alloy of Mg and Ag. When the second electrode 263 is formed of the semi-transmissive conductive material, emission efficiency is enhanced by a micro-cavity effect. A capping layer may be provided on the second electrode 263.

The encapsulation layer 130 may be provided on the light emitting device layer 120. The encapsulation layer 130 may include an encapsulation film 270.

The encapsulation film 270 prevents oxygen or water from penetrating into the light emitting layer 262 and the second electrode 263. Thus, the encapsulation film 270 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, and/or the like.

Moreover, the encapsulation film 270 may further include at least one organic layer. The organic layer may be provided to have a sufficient thickness for preventing particles from penetrating into the light emitting layer 262 and the second electrode 263 via the encapsulation film 270.

A color filter layer may be provided on the encapsulation layer 130. The color filter layer may include a plurality of color filters and a black matrix. The color filters may be respectively disposed in correspondence with the pixels. The black matrix may be disposed between adjacent color filters, for preventing colors from being mixed when light of one pixel travels to a color filter of an adjacent pixel. The black matrix may be disposed in correspondence with the bank 264. An overcoat layer for planarizing a step height caused by the color filters and the black matrix may be provided on the color filters.

Figure 7:
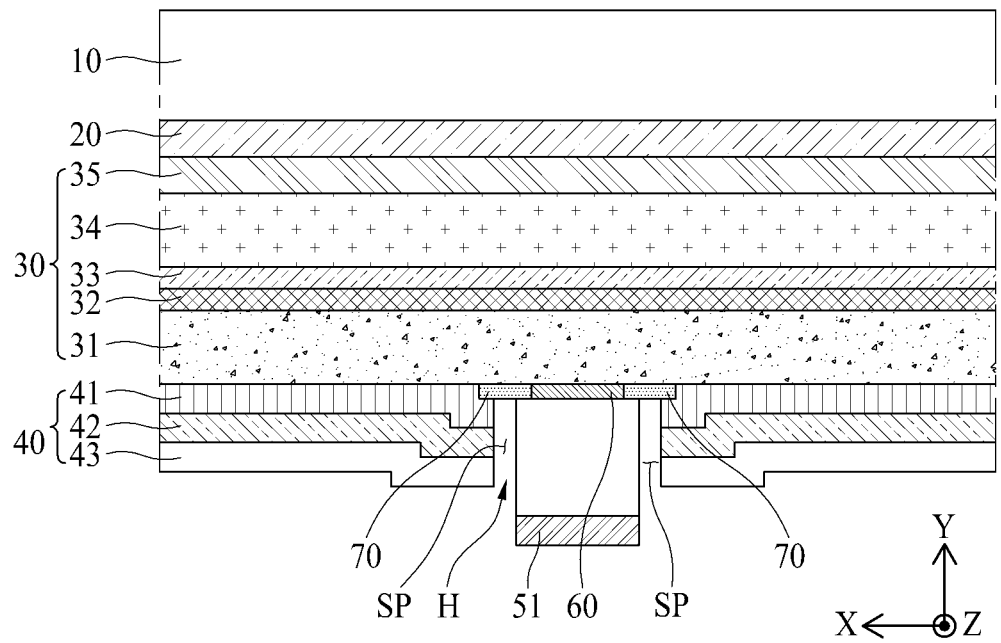
FIG. 7 is an enlarged cross-sectional view illustrating a second example of the area A of FIG. 3 according to an embodiment of the present disclosure.

FIG. 7 is an enlarged cross-sectional view illustrating a second example of the area A of FIG. 3.

Referring to FIG. 7, a display device according to a second embodiment of the present disclosure can include a cover substrate 10, a display module 30, a heat dissipation film 40, a fingerprint scanner 50, a first adhesive layer 20, a flexible circuit board 51, a second adhesive layer 60, and a light blocking layer 70. Also, the display module 30 can include a support substrate 31, a flexible substrate 32, a pixel array layer 33, a barrier film 34, and a polarization film 35. Also, the heat dissipation film 40 may include a cushion layer 41, a heat dissipation layer 42, and an anti-electrostatic layer 43.

The cover substrate 10, the first adhesive layer 20, the display module 30, the heat dissipation film 40, the fingerprint scanner 50, the flexible circuit board 51, and the second adhesive layer 60 illustrated in FIG. 7 are substantially the same as the elements described above with reference to FIG. 4, and thus, their detailed descriptions are not repeated.

The light blocking layer 70 can be disposed on a rear surface of the display module 30. OCR can be coated on a front surface of the light blocking layer 70, and thus, the light blocking layer 70 can be attached on the rear surface of the display module 30. The light blocking layer 70 may be disposed in an area corresponding to a space SP between the fingerprint scanner 50 and the heat dissipation film 40 with respect to the rear surface of the display module 30. Accordingly, light is prevented from passing through the space SP between the fingerprint scanner 50 and the heat dissipation film 40 by the light blocking layer 70.

When the light blocking layer 70 is disposed in the area corresponding to the space SP between the fingerprint scanner 50 and the heat dissipation film 40 as in FIG. 7, light is prevented from passing through the space SP between the fingerprint scanner 50 and the heat dissipation film 40, and thus, the flexible circuit board 51 may not be disposed to cover a hole H of the heat dissipation film 40. Also, the light blocking layer 70 can be disposed in the area corresponding to the space SP between the fingerprint scanner 50 and the heat dissipation film 40 with respect to the rear surface of the display module 30, the cushion layer 41 can be disposed to overlap an end of the light blocking layer 70.

Moreover, the light blocking layer 70 is not limited to an example where the light blocking layer 70 is disposed in the area corresponding to the space SP between the fingerprint scanner 50 and the heat dissipation film 40 with respect to the rear surface of the display module 30. In other embodiments, the light blocking layer 70 may be disposed on the whole rear surface of the display module 30. In this instance, the fingerprint scanner 50 may have difficulty identifying a fingerprint by using the optical type, and thus, may be implemented as the ultrasound type.

As described above, in the second embodiment of the present disclosure, the light blocking layer 70 can be disposed in the area corresponding to the space SP between the fingerprint scanner 50 and the heat dissipation film 40 with respect to the rear surface of the display module 30. As a result, in the second embodiment of the present disclosure, light is prevented from passing through the space SP between the fingerprint scanner 50 and the heat dissipation film 40, and thus, a luminance difference caused by the deterioration of an organic light emitting device does not occur between an area including the space SP between the heat dissipation film 40 and the fingerprint scanner 50 and another area from which the heat dissipation film 40 is not removed. Accordingly, according to the second embodiment of the present disclosure, smears such as shadow mura are not perceived by a user.

Figure 8:
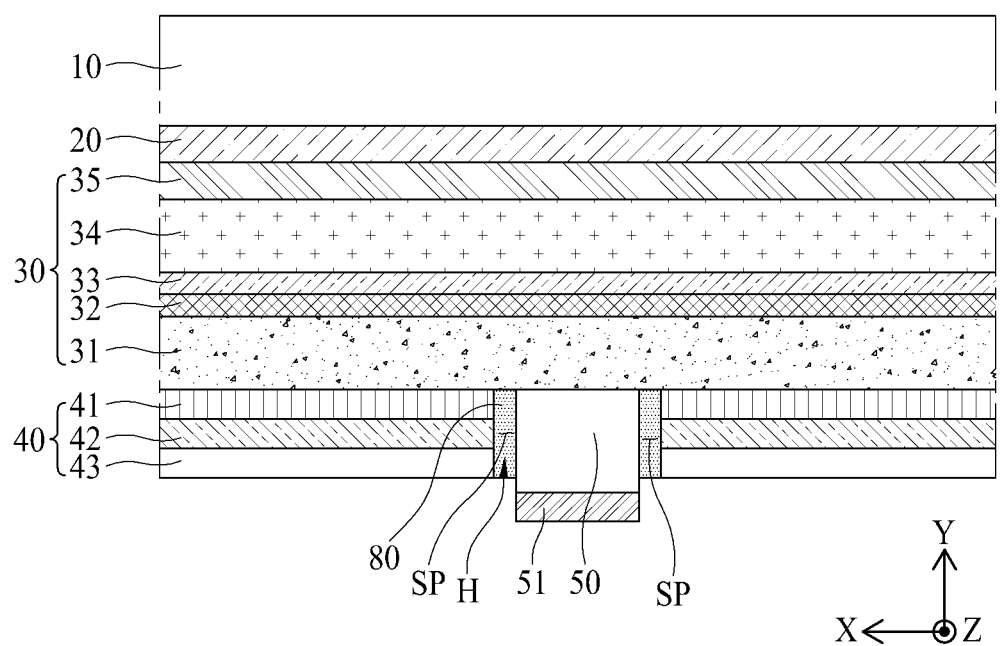
FIG. 8 is an enlarged cross-sectional view illustrating a third example of the area A of FIG. 3 according to an embodiment of the present disclosure.

FIG. 8 is an enlarged cross-sectional view illustrating a third example of the area A of FIG. 3.

Referring to FIG. 8, a display device according to a third embodiment of the present disclosure can include a cover substrate 10, a display module 30, a heat dissipation film 40, a fingerprint scanner 50, a first adhesive layer 20, a flexible circuit board 51, and a resin 80. Also, the display module 30 can include a support substrate 31, a flexible substrate 32, a pixel array layer 33, a barrier film 34, and a polarization film 35. Also, the heat dissipation film 40 can include a cushion layer 41, a heat dissipation layer 42, and an anti-electrostatic layer 43.

The cover substrate 10, the first adhesive layer 20, the display module 30, the heat dissipation film 40, and the fingerprint scanner 50 illustrated in FIG. 8 are substantially the same as the elements described above with reference to FIG. 4, and thus, their detailed descriptions are not repeated. Also, the flexible circuit board 51 illustrated in FIG. 8 is substantially the same as the flexible circuit board 51 described above with reference to FIG. 7, and thus, its detailed description is not repeated.

The resin 80 may be disposed in an area corresponding to a space SP between the fingerprint scanner 50 and the heat dissipation film 40 with respect to a rear surface of the display module 30. The resin 80 may be formed to have a color, and in order to increase a light blocking effect, the resin 80 may be formed in black. Accordingly, light is prevented from passing through the space SP between the fingerprint scanner 50 and the heat dissipation film 40.

Moreover, the resin 80 may be coated on the space SP between the fingerprint scanner 50 and the heat dissipation film 40, and then, may be cured, whereby the resin 80 may attach the fingerprint scanner 50 on the heat dissipation film 40. Therefore, the second adhesive layer 60 for attaching the fingerprint scanner 50 on the rear surface of the display module 30 may be omitted.

Moreover, as in FIG. 8, the resin 80 can be disposed in the space SP between the fingerprint scanner 50 and the heat dissipation film 40 as in FIG. 7, and light is prevented from passing through the space SP between the fingerprint scanner 50 and the heat dissipation film 40, and thus, the flexible circuit board 51 may not be disposed to cover a hole H of the heat dissipation film 40.

As described above, in the third embodiment of the present disclosure, the resin 80 can be disposed in the space SP between the fingerprint scanner 50 and the heat dissipation film 40 with respect to the rear surface of the display module 30. As a result, in the third embodiment of the present disclosure, light is prevented from passing through the space SP between the fingerprint scanner 50 and the heat dissipation film 40, and thus, a luminance difference caused by the deterioration of an organic light emitting device does not occur between an area including the space SP between the heat dissipation film 40 and the fingerprint scanner 50 and another area from which the heat dissipation film 40 is not removed. Accordingly, according to the third embodiment of the present disclosure, smears such as shadow mura are not perceived by a user.

Moreover, in a configuration of attaching the fingerprint scanner 50 by using the second adhesive layer 60, pressure may be applied for attaching the fingerprint scanner 50 in the rear surface of the display module 30, and due to this, a user perceives a pressed mark of the second adhesive layer 60 in front of the display module 30. However, in the third embodiment of the present embodiment, the resin 80 may be coated on the space SP between the fingerprint scanner 50 and the heat dissipation film 40, and then, may be cured, whereby the resin 80 may attach the fingerprint scanner 50 on the heat dissipation film 40. Accordingly, in the third embodiment of the present embodiment, the pressed mark of the second adhesive layer 60 is not perceived by the user in front of the display module 30.

Figure 9:
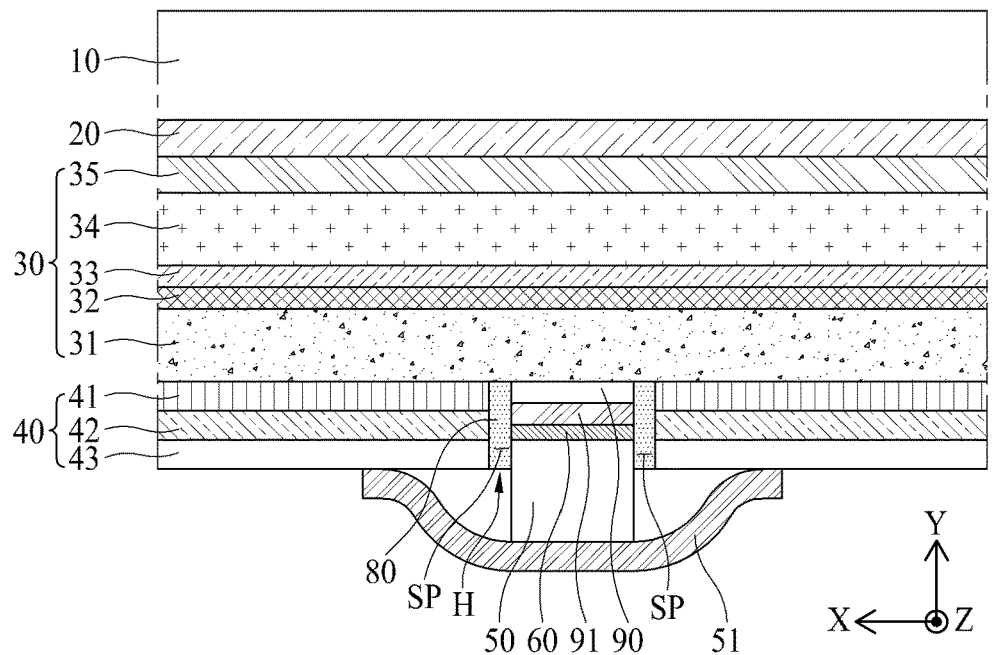
FIG. 9 is an enlarged cross-sectional view illustrating a fourth example of the area A of FIG. 3 according to an embodiment of the present disclosure.

FIG. 9 is an enlarged cross-sectional view illustrating a fourth example of the area A of FIG. 3.

Referring to FIG. 9, a display device according to a fourth embodiment of the present disclosure can include a cover substrate 10, a display module 30, a heat dissipation film 40, a fingerprint scanner 50, a first adhesive layer 20, a flexible circuit board 51, a second adhesive layer 60, a resin 80, a supplement layer 90, and a thin metal layer 91. Also, the display module 30 may include a support substrate 31, a flexible substrate 32, a pixel array layer 33, a barrier film 34, and a polarization film 35. Also, the heat dissipation film 40 can include a cushion layer 41, a heat dissipation layer 42, and an anti-electrostatic layer 43.

The cover substrate 10, the first adhesive layer 20, the display module 30, the heat dissipation film 40, the fingerprint scanner 50, the flexible circuit board 51, and the second adhesive layer 60 illustrated in FIG. 9 are substantially the same as the elements described above with reference to FIG. 4, and thus, their detailed descriptions are not repeated.

The supplement layer 90 can be disposed on a rear surface of the display module 30. The supplement layer 90 can be a layer for solving a problem where in a situation of applying pressure for attaching the fingerprint scanner 50 with respect to the rear surface of the display module 30, a pressed mark of the second adhesive layer 60 is perceived by a user in front of the display module 30. The supplement layer 90 may be formed of a plastic layer, such as PET, or a metal layer such as stainless use steel (SUS), but is not limited thereto. The supplement layer 90 can be provided in only an area corresponding to the fingerprint scanner 50. However, the present embodiment is not limited thereto. In other embodiments, the supplement layer 90 can be disposed on a whole rear surface of the support substrate 31.

The thin metal layer 91 can be disposed on a rear surface of the supplement layer 90. When the fingerprint scanner 50 is the ultrasound type, the thin metal layer 91 can be a layer for improving recognition of ultrasound waves. When the fingerprint scanner 50 is the ultrasound type, if a density of a layer which is disposed on the fingerprint scanner 50 and through which ultrasound waves pass is not uniform, an ultrasound recognition rate is lowered. Further, if the thin metal layer 91 which is disposed on the fingerprint scanner 50 and through which ultrasound waves pass has a uniform density, an ultrasound recognition rate increases. For example, the thin metal layer 91 can be a thin layer including Cu. Therefore, in the fourth embodiment of the present disclosure, the fingerprint scanner 50 can be the ultrasound type. When the thin metal layer 91 is omitted, the fingerprint scanner 50 can be implemented as the optical type.

The resin 80 can be disposed in a space SP between the heat dissipation film 40 and the supplement layer 90, a space SP between the heat dissipation film 40 and the thin metal layer 91, and/or a space SP between the heat dissipation film 40 and the fingerprint scanner 50, with respect to a rear surface of the display module 30. The resin 80 can be coated on the space SP between the heat dissipation film 40 and the supplement layer 90, the space SP between the heat dissipation film 40 and the thin metal layer 91, and/or the space SP between the heat dissipation film 40 and the fingerprint scanner 50, and then, may be cured, whereby the resin 80 can attach the heat dissipation film 40 on the supplement layer 90, the thin metal layer 91, and/or the fingerprint scanner 50. Particularly, when the resin 80 attaches the heat dissipation film 40 on the fingerprint scanner 50, the second adhesive layer 60 may be omitted.

The resin 80 can be formed to have a color, and in order to increase a light blocking effect, the resin 80 can be formed in black. In this instance, light is prevented from passing through the space SP between the fingerprint scanner 50 and the heat dissipation film 40, and thus, the flexible circuit board 51 may not be disposed to cover a hole H of the heat dissipation film 40.

As described above, in the fourth embodiment of the present disclosure, the flexible circuit board 51 can be disposed to cover the hole H of the heat dissipation film 40, or the resin 80 may be disposed in the space SP between the heat dissipation film 40 and the supplement layer 90, the space SP between the heat dissipation film 40 and the thin metal layer 91, and/or the space SP between the heat dissipation film 40 and the fingerprint scanner 50. As a result, in the fourth embodiment of the present disclosure, light is prevented from passing through the space SP between the fingerprint scanner 50 and the heat dissipation film 40, and thus, a luminance difference caused by the deterioration of an organic light emitting device does not occur between an area including the space SP between the heat dissipation film 40 and the fingerprint scanner 50 and another area from which the heat dissipation film 40 is not removed. Accordingly, according to the fourth embodiment of the present disclosure, smears such as shadow mura are not perceived by a user.

Moreover, in the fourth embodiment of the present disclosure, the supplement layer 90 can be disposed on the rear surface of the display module 30, and thus, when pressure is applied for attaching the fingerprint scanner 50 with respect to the rear surface of the display module 30, a pressed mark of the second adhesive layer 60 is not perceived by a user in front of the display module 30. Moreover, in the fourth embodiment of the present disclosure, the thin metal layer 91 may be disposed on the rear surface of the supplement layer 90, and thus, when the fingerprint scanner 50 is the ultrasound type, an ultrasound recognition rate is improved.

Figure 10:
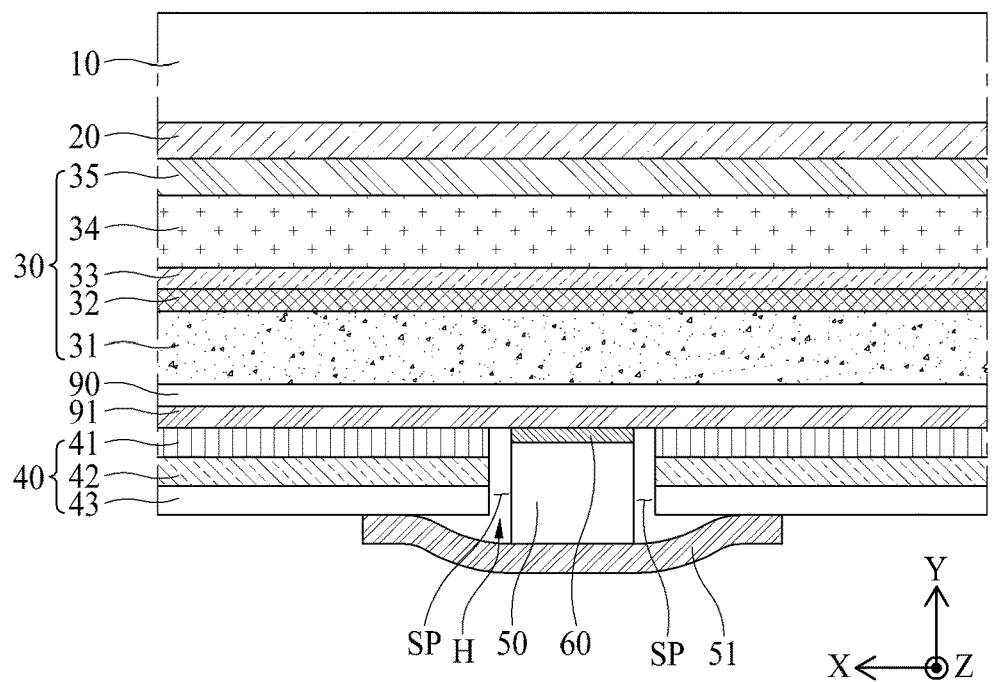
FIG. 10 is an enlarged cross-sectional view illustrating a fifth example of the area A of FIG. 3 according to an embodiment of the present disclosure.

FIG. 10 is an enlarged cross-sectional view illustrating a fifth example of the area A of FIG. 3.

Referring to FIG. 10, a display device according to a fifth embodiment of the present disclosure can include a cover substrate 10, a display module 30, a heat dissipation film 40, a fingerprint scanner 50, a first adhesive layer 20, a flexible circuit board 51, a second adhesive layer 60, a supplement layer 90, and a thin metal layer 91. Also, the display module 30 can include a support substrate 31, a flexible substrate 32, a pixel array layer 33, a barrier film 34, and a polarization film 35. Also, the heat dissipation film 40 may include a cushion layer 41, a heat dissipation layer 42, and an anti-electrostatic layer 43.

The cover substrate 10, the first adhesive layer 20, the display module 30, the heat dissipation film 40, the fingerprint scanner 50, the flexible circuit board 51, and the second adhesive layer 60 illustrated in FIG. 10 are substantially the same as the elements described above with reference to FIG. 4, and thus, their detailed descriptions are not repeated.

Moreover, except that the supplement layer 90 and the thin metal layer 91 are disposed on the whole rear surface of the display module 30, the supplement layer 90 and the thin metal layer 91 illustrated in FIG. 10 are substantially the same as the elements described above with reference to FIG. 9, and thus, their detailed descriptions are not repeated.

Figure 11:
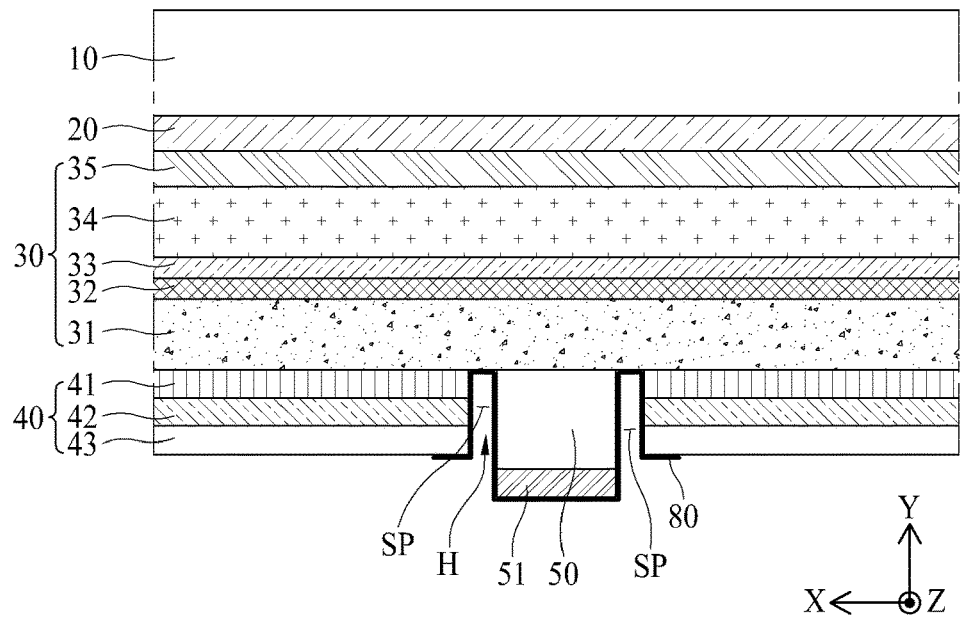
FIG. 11 is an enlarged cross-sectional view illustrating a sixth example of the area A of FIG. 3 according to an embodiment of the present disclosure.

FIG. 11 is an enlarged cross-sectional view illustrating a sixth example of the area A of FIG. 3.

Referring to FIG. 11, a display device according to a sixth embodiment of the present disclosure can include a cover substrate 10, a display module 30, a heat dissipation film 40, a fingerprint scanner 50, a first adhesive layer 20, a flexible circuit board 51, and a second adhesive layer 60. Also, the display module 30 can include a support substrate 31, a flexible substrate 32, a pixel array layer 33, a barrier film 34, and a polarization film 35. Also, the heat dissipation film 40 may include a cushion layer 41, a heat dissipation layer 42, and an anti-electrostatic layer 43.

The cover substrate 10, the first adhesive layer 20, the display module 30, the heat dissipation film 40, the fingerprint scanner 50, and the second adhesive layer 60 illustrated in FIG. 11 are substantially the same as the elements described above with reference to FIG. 4, and thus, their detailed descriptions are not repeated. Also, the flexible circuit board 51 illustrated in FIG. 11 is substantially the same as the flexible circuit board 51 described above with reference to FIG. 7, and thus, its detailed description is not repeated.

Moreover, a resin 80 illustrated in FIG. 11 can be sprayed on an area corresponding to a hole H of the heat dissipation film 40 and can be coated on a space SP between the heat dissipation film 40 and the fingerprint scanner 50. For example, the resin 80 can be sprayed on the space SP between the heat dissipation film 40 and the fingerprint scanner 50 and may be coated to cover a rear surface of the support substrate 31, a side surface of the second adhesive layer 60, a side surface of the fingerprint scanner 50, a side surface of the cushion layer 41, a side surface of the heat dissipation layer 42, and a side surface of the anti-electrostatic layer 43, which are exposed by the hole H of the heat dissipation film 40. Also, the resin 80 can be coated on a rear surface of the flexible circuit board 51 and a rear surface of the anti-electrostatic layer 43. The resin 80 can be coated, and then, may be cured by an ultraviolet (UV) curer. The resin 80 may be formed to have a color, and in order to increase a light blocking effect, the resin 80 may be formed in black. In this instance, the resin 80 may include black pigments and a photoinitiator. A thickness by which the resin 80 is coated may be 10 μm to 100 μm.

Figure 12:
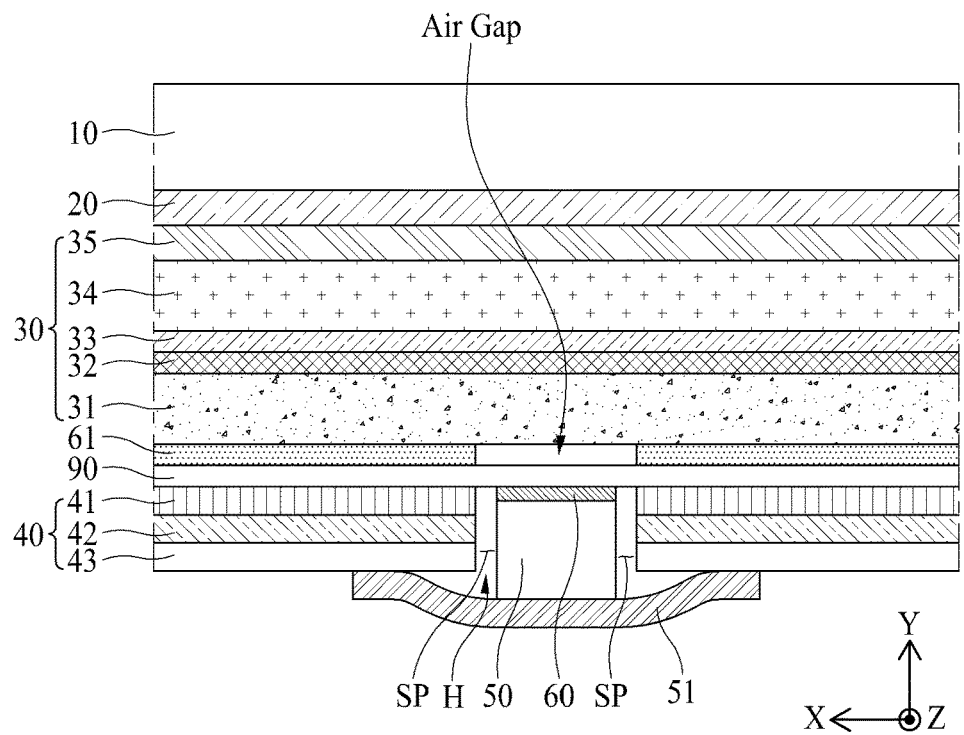
FIG. 12 is an enlarged cross-sectional view illustrating a seventh example of the area A of FIG. 3 according to an embodiment of the present disclosure.

FIG. 12 is an enlarged cross-sectional view illustrating a seventh example of the area A of FIG. 3.

Referring to FIG. 12, a display device according to a seventh embodiment of the present disclosure may include a cover substrate 10, a display module 30, a heat dissipation film 40, a fingerprint scanner 50, a first adhesive layer 20, a flexible circuit board 51, a second adhesive layer 60, a supplement layer 90, an air gap Air Gap, and a third adhesive layer 61. Also, the display module 30 may include a support substrate 31, a flexible substrate 32, a pixel array layer 33, a barrier film 34, and a polarization film 35. Also, the heat dissipation film 40 may include a cushion layer 41, a heat dissipation layer 42, and an anti-electrostatic layer 43.

The cover substrate 10, the first adhesive layer 20, and the display module 30 illustrated in FIG. 12 are substantially the same as the elements described above with reference to FIG. 4, and thus, their detailed descriptions are not repeated.

Referring to FIG. 12, the third adhesive layer 61 can be disposed between the support substrate 31 and the supplement layer 90 and cam attach the supplement layer 90 on the support substrate 31. The third adhesive layer 61 may be an OCR or an OCA film.

The third adhesive layer 61 can be a pressure sensitive adhesive (PSA) where an adhesive material acts when pressure is applied for attaching an adhesive on an adhesive surface. If the third adhesive layer 61 is the PSA, the third adhesive layer 61 may be one of a solvent base PSA, a water dispersion PSA, and a rubber PSA, but is not limited thereto.

The third adhesive layer 61, as illustrated in FIG. 12, can include an area from which a portion of the third adhesive layer 61 is removed, so that the air gap Air Gap is provided between the support substrate 31 and the supplement layer 90 in correspondence with an area where the fingerprint scanner 50 is disposed. For example, the third adhesive layer 61 may not be disposed in an area where the fingerprint scanner 50 is to be disposed.

Moreover, the third adhesive layer 61 may not be disposed in an area corresponding to a hole H of the heat dissipation film 40 which is provided for disposing the fingerprint scanner 50. Therefore, the air gap Air Gap can be provided in a region, corresponding to the hole H of the heat dissipation film 40, of an area between the support substrate 31 and the supplement layer 90.

The supplement layer 90 may be disposed on a rear surface of the support substrate 31. Also, the supplement layer 90 can be disposed on a whole surface of the support substrate 31. Also, the supplement layer 90 can be attached on the support substrate 31 by the third adhesive layer 61. Also, the air gap Air Gap can be provided between the supplement layer 90 and the support substrate 31. A position of the air gap Air Gap provided between the supplement layer 90 and the support substrate 31 may be an area corresponding to an area where the fingerprint scanner 50 is disposed.

The supplement layer 90 can be formed of the same material as that of the support substrate 31. Therefore, the supplement layer 90 may be formed of a plastic material such as PET. However, the present embodiment is not limited thereto, and the supplement layer 90 may be formed of a metal layer such as SUS.

The supplement layer 90 can act as a support layer for attaching the fingerprint scanner 50. Also, the supplement layer 90 may be attached on the support substrate 31 by the third adhesive layer 61, and the air gap Air Gap may be provided between the support substrate 31 and the supplement layer 90, thereby preventing a pressed defect from occurring in the display module 50.

When pressure is applied for attaching the fingerprint scanner 50 with respect to a rear surface of the display module 30, the air gap Air Gap can prevent the pressure from being applied to the display module 30. Thus, when pressure is applied to the fingerprint scanner 50 for attaching the fingerprint scanner 50 on the supplement layer 90, the air gap Air Gap can perform a buffering function of preventing the display module 30 from being applied with pressure from the fingerprint scanner 50. Therefore, a pressed defect is prevented from occurring in the display module 30. The cushion layer 41 can be disposed on a rear surface of the supplement layer 90. When an external impact is applied to the display module 30, the cushion layer 41 may reduce the impact. An adhesive material may be coated on a front surface of the cushion layer 41, and thus, the heat dissipation film 40 may be attached on the rear surface of the support substrate 31 without a separate adhesive layer.

The heat dissipation layer 42 may be disposed on a rear surface of the cushion layer 41. The heat dissipation layer 42 may be formed of a metal layer (for example, graphite) having high thermal conductivity to effectively dissipate heat occurring in the display module 30, but is not limited thereto.

The anti-electrostatic layer 43 can be disposed on a rear surface of the heat dissipation layer 42. The anti-electrostatic layer 43 may protect the display module 30 from static electricity applied from the outside, and like the heat dissipation layer 42, the anti-electrostatic layer 43 can dissipate the heat occurring in the display module 30. The anti-electrostatic layer 43 may be formed of Cu, but is not limited thereto.

The fingerprint scanner 50 can be mounted on the flexible circuit board 51. The flexible circuit board 51 may be an FPCB. The flexible circuit board 51 may include a connector connected to a cable connected to an application board of a portable electronic device. An application chip can be mounted on the application board. Therefore, information about fingerprint authentication by the fingerprint scanner 50 may be transmitted to the application board of the portable electronic device through the flexible circuit board 51.

The fingerprint scanner 50 can be disposed in a hole H of the heat dissipation film 40. The hole H of the heat dissipation film 40 may be an area from which a portion of the heat dissipation film 40 is removed, for attaching the fingerprint scanner 50 on the rear surface of the display module 30. Since the fingerprint scanner 50 is disposed in the hole H of the heat dissipation film 40, a space SP can be provided between the fingerprint scanner 50 and the heat dissipation film 40. When light passes through the space SP between the fingerprint scanner 50 and the heat dissipation film 40, an organic light emitting device provided in an area corresponding to the space SP between the fingerprint scanner 50 and the heat dissipation film 40 can be deteriorated.

The flexible circuit board 51 may be disposed to cover the hole H of the heat dissipation film 40. In more detail, the flexible circuit board 51 may be disposed to cover the space SP between the fingerprint scanner 50 and the heat dissipation film 40.

Moreover, as illustrated in FIG. 12, an end of the flexible circuit board 51 can be bent and may thereby contact the rear surface of the heat dissipation film 40. The flexible circuit board 51 may be attached on the rear surface of the heat dissipation film 40 by using a double-sided adhesive film. In this instance, the flexible circuit board 51 may more effectively prevent light from passing through the space SP between the fingerprint scanner 50 and the heat dissipation film 40.

However, the present embodiment is not limited thereto. In other embodiments, the space SP between the fingerprint scanner 50 and the heat dissipation film 40 may be covered by using a light blocking material.

As described above with reference to FIG. 7, a light blocking layer may be disposed in an area corresponding to the space SP between the heat dissipation film 40 and the fingerprint scanner 50 with respect to the rear surface of the display module 30. As a result, light is prevented from passing through the space SP between the heat dissipation film 40 and the fingerprint scanner 50.

Moreover, as described above with reference to FIGS. 8 and 11, a black resin may be disposed in the space SP between the heat dissipation film 40 and the fingerprint scanner 50 with respect to the rear surface of the display module 30.

Moreover, if the space SP between the heat dissipation film 40 and the fingerprint scanner 50 is covered by using the light blocking material, light is prevented from passing through the space SP between the heat dissipation film 40 and the fingerprint scanner 50, and thus, the flexible circuit board 51 may not be disposed to cover a hole H of the heat dissipation film 40.

The second adhesive layer 60 may attach the supplement layer 90 on the fingerprint scanner 50. The second adhesive layer 60 may be an OCR or an OCA film.

The second adhesive layer 60 may be a PSA where an adhesive material acts when pressure is applied for attaching an adhesive on an adhesive surface. If the second adhesive layer 60 is the PSA, the second adhesive layer 60 may be one of a solvent base PSA, a water dispersion PSA, and a rubber PSA, but is not limited thereto.

As described above, in the seventh embodiment of the present disclosure, an air gap Air Gap may be provided in a partial area between the support substrate 31 and the supplement layer 90 with respect to a rear surface of the display module 30. Therefore, in the seventh embodiment of the present disclosure, when pressure is applied for attaching the fingerprint scanner 50 on the rear surface of the display module 30, the air gap Air Gap may perform a buffering function to prevent the display module 30 from being pressed. Accordingly, a pressed mark is prevented from occurring in an area corresponding to the fingerprint scanner 50 with respect to the rear surface of the display module 30.

Figure 13:
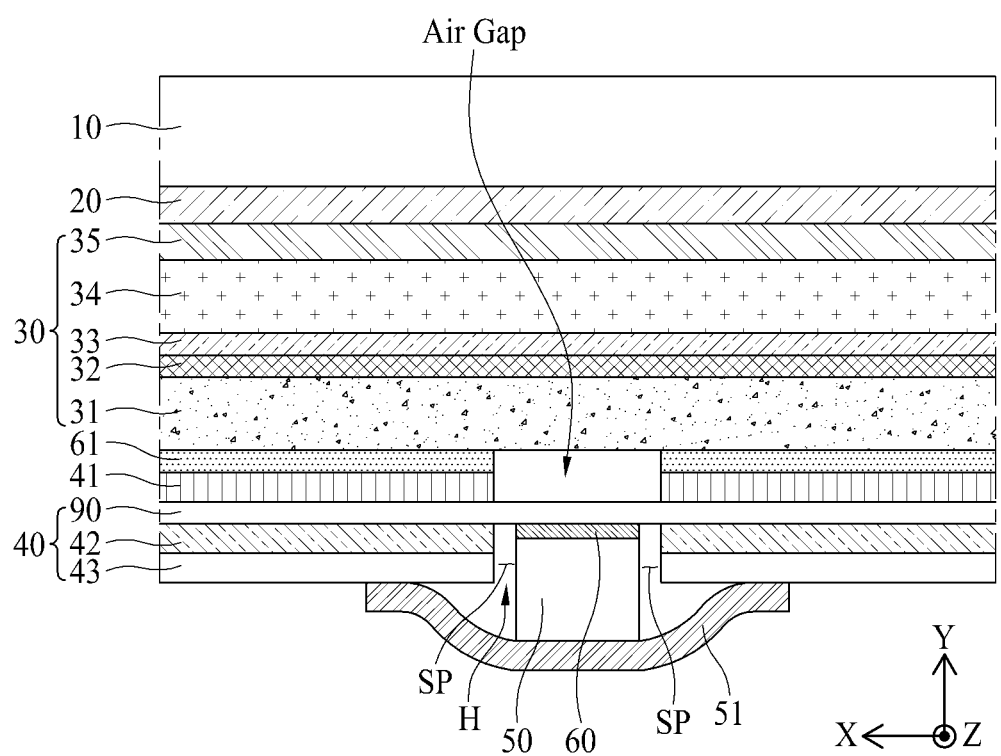
FIG. 13 is an enlarged cross-sectional view illustrating an eighth example of the area A of FIG. 3 according to an embodiment of the present disclosure.

FIG. 13 is an enlarged cross-sectional view illustrating an eighth example of the area A of FIG. 3.

Referring to FIG. 13, a display device according to an eighth embodiment of the present disclosure can include a cover substrate 10, a display module 30, a heat dissipation film 40, a fingerprint scanner 50, a first adhesive layer 20, a flexible circuit board 51, a second adhesive layer 60, a supplement layer 90, an air gap Air Gap, and a third adhesive layer 61. Also, the display module 30 may include a support substrate 31, a flexible substrate 32, a pixel array layer 33, a barrier film 34, and a polarization film 35. Also, the heat dissipation film 40 can include a cushion layer 41, a heat dissipation layer 42, and an anti-electrostatic layer 43.

The cover substrate 10, the first adhesive layer 20, and the display module 30 illustrated in FIG. 13 are substantially the same as the elements described above with reference to FIG. 4, and thus, their detailed descriptions are not repeated. Also, the heat dissipation film 40, the fingerprint scanner 50, the second adhesive layer 60, the third adhesive layer 61, the heat dissipation layer 42, the anti-electrostatic layer 43, and the flexible circuit board 51 illustrated in FIG. 13 are substantially the same as the elements described above with reference to FIG. 12, and thus, their detailed descriptions are not repeated.

Referring to FIG. 13, the cushion layer 41 can be disposed between the supplement layer 90 and the support substrate 31. As illustrated in FIG. 13, the cushion layer 41 can include an area from which a portion of the cushion layer 41 is removed, so that the air gap Air Gap is provided between the support substrate 31 and the supplement layer 90 in correspondence with an area where the fingerprint scanner 50 is disposed. For example, the cushion layer 41 may not be disposed in an area where the fingerprint scanner 50 is to be disposed.

Moreover, the cushion layer 41 may not be disposed in an area corresponding to a hole H of the anti-electrostatic layer 43 and the heat dissipation layer 42 which are provided for disposing the fingerprint scanner 50. Therefore, the air gap Air Gap can be provided in a region, corresponding to the hole H of the anti-electrostatic layer 43 and the heat dissipation layer 42, of an area between the support substrate 31 and the supplement layer 90.

The cushion layer 41 can be attached on the support substrate 31 by the third adhesive layer 61 disposed between the cushion layer 41 and the support substrate 31.

Therefore, a height of the air gap Air Gap provided between the support substrate 31 and the supplement layer 90 may be substantially the same as a total height of the cushion layer 41 and the third adhesive layer 61.

The supplement layer 90 can be disposed on a rear surface of the support substrate 31. Also, the supplement layer 90 can be disposed on a whole surface of the support substrate 31. For example, the supplement layer 90 can be disposed on a rear surface of the cushion layer 41 disposed on a rear surface of the support substrate 31.

The air gap Air Gap can be provided between the support substrate 31 and the supplement layer 90, thereby preventing a pressed defect from occurring in the display module 30.

Referring to FIG. 13, the display device may include the display module 30 which displays an image, the supplement layer 90 disposed on a rear surface of the display module 30, the fingerprint scanner 50 attached on a rear surface of the supplement layer 90, and the air gap Air Gap provided in a first area between the supplement layer 90 and the display module 30. Also, the first area where the air gap Air Gap is disposed may be an area corresponding to an area where the fingerprint scanner 50 is attached on the rear surface of the supplement layer 90.

Moreover, the supplement layer 90 can be attached on the display module 30 by an adhesive, and the adhesive may be disposed in a second area between the supplement layer 90 and the display module 30. Therefore, the second area may be an area other than the first area in an area between the supplement layer 90 and the display module 30.

Moreover, the display device can include the cushion layer 41 disposed in the second area. Also, the display device may include the heat dissipation layer 42 which is spaced apart from the fingerprint scanner 50 attached on the rear surface and is disposed on the rear surface of the supplement layer 90.

Moreover, the display device can include a light blocking structure disposed in a space between the fingerprint scanner 50 and the heat dissipation layer 42. Also, the display device may further include the flexible circuit board 51 mounted with the fingerprint scanner 50. Also, the flexible circuit board 51 may cover the space between the fingerprint scanner 50 and the heat dissipation layer 42.

According to an embodiment of the present disclosure, a display device may include: a cover substrate; a display module disposed on a rear surface of the cover substrate and configured to display an image; a heat dissipation film disposed on a rear surface of the display module; a hole disposed in the heat dissipation film; a flexible circuit board covering the hole in the heat dissipation film and configured to block light; and a fingerprint scanner mounted on the flexible circuit board, disposed in the hole of the heat dissipation film, and separated from the heat dissipation film by a space, the flexible circuit board may cover the space between the heat dissipation film and the fingerprint scanner.

According to an embodiment of the present disclosure, in the display device, the flexible circuit board fully covers the hole in the heat dissipation film.

According to an embodiment of the present disclosure, in the display device, the flexible circuit board may contact a rear surface of the heat dissipation film.

According to an embodiment of the present disclosure, the display device may further include a double-sided adhesive film attaching the heat dissipation film on the flexible circuit board.

According to an embodiment of the present disclosure, in the display device, the fingerprint scanner may be an optical type fingerprint scanner or an ultrasound type fingerprint scanner.

According to an embodiment of the present disclosure, the display device may further include a supplement layer disposed between the fingerprint scanner and the display module, the supplement layer may be configured to prevent a pressure applied to the fingerprint scanner from being transferred to the display module.

According to an embodiment of the present disclosure, the display device may further include an air gap between the supplement layer and the display module, the air gap may be configured to prevent the supplement layer from contacting the display module.

According to an embodiment of the present disclosure, the display device may further include a thin metal layer disposed between the supplement layer and the fingerprint scanner.

According to an embodiment of the present disclosure, in the display device, the heat dissipation film may include: a cushion layer disposed on the rear surface of the display module, the cushion layer reducing an impact when the impact is applied from the outside to the display module; a heat dissipation layer disposed on a rear surface of the cushion layer to dissipate heat occurring in the display module; and an anti-electrostatic layer disposed on a rear surface of the heat dissipation layer to protect the display module from static electricity applied from the outside.

According to an embodiment of the present disclosure, a display device including: a display module configured to display an image; a heat dissipation film disposed on a rear surface of the display module; a hole disposed in the heat dissipation film; a fingerprint scanner disposed on the rear surface of the display module inside the hole of the heat dissipation film; and a light blocking structure disposed in a space between the fingerprint scanner and the heat dissipation film, and configured to block light.

According to an embodiment of the present disclosure, in the display device, the fingerprint scanner may be an optical type fingerprint scanner or ultrasound type fingerprint scanner.

According to an embodiment of the present disclosure, the display device may further include a supplement layer disposed between the fingerprint scanner and the display module.

According to an embodiment of the present disclosure, the display device may further include an air gap between the supplement layer and the display module, the air gap may be configured to prevent the supplement layer from contacting the display module.

According to an embodiment of the present disclosure, the display device may further include a thin metal layer disposed between the supplement layer and the fingerprint scanner.

According to an embodiment of the present disclosure, in the display device, the heat dissipation film includes a stepped portion overlapping with an outer edge of the light blocking structure.

According to an embodiment of the present disclosure, in the display device, the heat dissipation film may include: a cushion layer disposed on the rear surface of the display module, the cushion layer reducing an impact when the impact is applied from the outside to the display module; a heat dissipation layer disposed on a rear surface of the cushion layer to dissipate heat occurring in the display module; and an anti-electrostatic layer disposed on a rear surface of the heat dissipation layer to protect the display module from static electricity applied from the outside.

According to an embodiment of the present disclosure, in the display device, the light blocking structure may include a light blocking layer covering or filling the space between the fingerprint scanner and the heat dissipation film.

According to an embodiment of the present disclosure, in the display device, the light blocking structure may include a resin filled into the space between the fingerprint scanner and the heat dissipation film.

According to an embodiment of the present disclosure, in the display device, the resin may have at least one color.

According to an embodiment of the present disclosure, a display device including: a display module configured to display an image; a supplement layer disposed on a rear surface of the display module; a fingerprint scanner disposed on the rear surface of the display module; and an air gap between the supplement layer and the display module, and overlapping with the fingerprint scanner.

According to an embodiment of the present disclosure, in the display device, the supplement layer may be attached on the display module by an adhesive, and the adhesive is adjacent to the air gap.

According to an embodiment of the present disclosure, the display device may further include a cushion layer adjacent to the fingerprint scanner and disposed on the adhesive.

According to an embodiment of the present disclosure, the display device may further include a flexible circuit board connected to the fingerprint scanner and the flexible circuit board may cover a space between the fingerprint scanner and the heat dissipation layer. Also, the flexible circuit board may be configured to block light.

According to an embodiment of the present disclosure, a display device including: a display module displaying an image; a supplement layer on a rear surface of the display module; a fingerprint scanner attached on the rear surface of the display module; and an air gap in a first area between the supplement layer and the display module. Also, the first area where the air gap is disposed may be an area corresponding to an area where the fingerprint scanner is attached on a rear surface of the supplement layer.

According to an embodiment of the present disclosure, in the display device, the supplement layer may be attached on the display module by an adhesive, and the adhesive may be disposed in a second area which is an area other than the first area.

According to an embodiment of the present disclosure, the display device may further include a cushion layer in the second area.

According to an embodiment of the present disclosure, the display device may further include a heat dissipation layer spaced apart from the fingerprint scanner and disposed on a rear surface of the supplement layer.

According to an embodiment of the present disclosure, the display device may further include a light blocking structure in a space between the fingerprint scanner and the heat dissipation layer.

According to an embodiment of the present disclosure, the display device may further include a flexible circuit board mounted with the fingerprint scanner. Also, the flexible circuit board may cover a space between the fingerprint scanner and the heat dissipation layer.

As described above, in the eighth embodiment of the present disclosure, an air gap Air Gap can be provided in a partial area between the support substrate 31 and the supplement layer 90 with respect to a rear surface of the display module 30. Therefore, in the eighth embodiment of the present disclosure, when pressure is applied for attaching the fingerprint scanner 50 on the rear surface of the display module 30, the air gap Air Gap may perform a buffering function to prevent the display module 30 from being pressed. Accordingly, a pressed mark is prevented from occurring in an area corresponding to the fingerprint scanner 50 with respect to the rear surface of the display module 30.

As described above, according to the embodiments of the present disclosure, the flexible circuit board can be disposed to cover the hole of the heat dissipation film. As a result, according to the embodiments of the present disclosure, light is prevented from passing through the space between the heat dissipation film and the fingerprint scanner, and thus, a luminance difference caused by the deterioration of an organic light emitting device does not occur between an area including the space between the heat dissipation film and the fingerprint scanner and another area from which the heat dissipation film is not removed. Accordingly, according to the embodiments of the present disclosure, smears such as shadow mura are not perceived by a user.

Moreover, according to the embodiments of the present disclosure, the light blocking layer can be disposed in an area corresponding to the space between the heat dissipation film and the fingerprint scanner with respect to the rear surface of the display module. As a result, according to the embodiments of the present disclosure, light is prevented from passing through the space between the heat dissipation film and the fingerprint scanner, and thus, a luminance difference caused by the deterioration of the organic light emitting device does not occur between the area including the space between the heat dissipation film and the fingerprint scanner and the other area from which the heat dissipation film is not removed. Accordingly, according to the embodiments of the present disclosure, smears such as shadow mura are not perceived by a user.

Moreover, according to the embodiments of the present disclosure, the supplement layer can be disposed on the rear surface of the display module, and thus, when pressure is applied for attaching the fingerprint scanner with respect to the rear surface of the display module, a pressed mark of the second adhesive layer is not perceived by a user in front of the display module.

Moreover, according to the embodiments of the present disclosure, the thin metal layer can be disposed on the rear surface of the supplement layer, and thus, if the fingerprint scanner is the ultrasound type, an ultrasound recognition rate is improved.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device comprising:
a cover substrate;
a display module disposed on a rear surface of the cover substrate and configured to display an image;
a heat dissipation film disposed on a rear surface of the display module;
a hole disposed in the heat dissipation film;
a flexible circuit board covering the hole in the heat dissipation film and configured to block light;
a fingerprint scanner mounted on the flexible circuit board, disposed in the hole of the heat dissipation film, and separated from the heat dissipation film by a space;
a supplement layer disposed between the fingerprint scanner and the display module; and
an air gap between the supplement layer and the display module,
wherein the supplement layer is configured to prevent a pressure applied to the fingerprint scanner from being transferred to the display module,
wherein the air gap is configured to prevent the supplement layer from contacting the display module, and
wherein the flexible circuit board covers the space between the heat dissipation film and the fingerprint scanner.

2. The display device of claim 1, wherein the flexible circuit board fully covers the hole in the heat dissipation film.

3. The display device of claim 1, wherein the flexible circuit board contacts a rear surface of the heat dissipation film.

4. The display device of claim 1, wherein the fingerprint scanner is an optical fingerprint scanner or an ultrasound fingerprint scanner.

5. The display device of claim 1, further comprising a metal layer disposed between the supplement layer and the fingerprint scanner.

6. A display device comprising:
a cover substrate;
a display module disposed on a rear surface of the cover substrate and configured to display an image;
a heat dissipation film disposed on a rear surface of the display module;
a hole disposed in the heat dissipation film;
a flexible circuit board covering the hole in the heat dissipation film and configured to block light; and
a fingerprint scanner mounted on the flexible circuit board, disposed in the hole of the heat dissipation film, and separated from the heat dissipation film by a space,
wherein the heat dissipation film comprises:
a cushion layer disposed on the rear surface of the display module;
a heat dissipation layer disposed on a rear surface of the cushion layer; and
an anti-electrostatic layer disposed on a rear surface of the heat dissipation layer.

7. A display device comprising:
a display module configured to display an image;
a heat dissipation film disposed on a rear surface of the display module;
a hole disposed in the heat dissipation film;

a fingerprint scanner disposed on the rear surface of the display module inside the hole of the heat dissipation film;

a light blocking structure disposed in a space between the fingerprint scanner and the heat dissipation film, and configured to block light;

a supplement layer disposed between the fingerprint scanner and the display module; and an air gap disposed between the supplement layer and the display module, wherein the air gap is configured to prevent the supplement layer from contacting the display module.

8. The display device of claim 7, wherein the fingerprint scanner is an optical fingerprint scanner or an ultrasound fingerprint scanner.

9. The display device of claim 7, further comprising a metal layer disposed between the supplement layer and the fingerprint scanner.

10. The display device of claim 7, wherein the heat dissipation film includes a stepped portion overlapping with an outer edge of the light blocking structure.

11. The display device of claim 7, wherein the heat dissipation film comprises:

a cushion layer disposed on the rear surface of the display module;

a heat dissipation layer disposed on a rear surface of the cushion layer; and an anti-electrostatic layer disposed on a rear surface of the heat dissipation layer.

12. The display device of claim 7, wherein the light blocking structure comprises a light blocking layer covering or filling the space between the fingerprint scanner and the heat dissipation film.

13. The display device of claim 7, wherein the light blocking structure comprises a resin filled in the space between the fingerprint scanner and the heat dissipation film.

\* \* \* \* \*